US011971865B2

(12) United States Patent
Bentley et al.

(10) Patent No.: US 11,971,865 B2
(45) Date of Patent: Apr. 30, 2024

(54) INTELLIGENT MODEL HIERARCHY FOR INFRASTRUCTURE MODELING

(71) Applicant: Bentley Systems, Incorporated, Exton, PA (US)

(72) Inventors: Keith A. Bentley, Elverson, PA (US); Casey Mullen, Exton, PA (US); Shaun Sewall, Glenmoore, PA (US)

(73) Assignee: Bentley Systems, Incorporated, Exton, PA (US)

( * ) Notice: Subject to any disclaimer, the term of this patent is extended or adjusted under 35 U.S.C. 154(b) by 153 days.

(21) Appl. No.: 15/700,450

(22) Filed: Sep. 11, 2017

(65) Prior Publication Data

US 2019/0079958 A1    Mar. 14, 2019

(51) Int. Cl.
*G06F 16/21* (2019.01)
*G06F 16/93* (2019.01)
(Continued)

(52) U.S. Cl.
CPC ............ *G06F 16/212* (2019.01); *G06F 16/93* (2019.01); *G06F 30/13* (2020.01); *G06Q 10/06* (2013.01); *G06Q 50/08* (2013.01)

(58) Field of Classification Search
CPC ........ G06F 7/10; G06F 16/122; G06F 16/285; G06F 11/32; G06F 16/248; G06F 3/167;
(Continued)

(56) References Cited

U.S. PATENT DOCUMENTS 5,761,664 A    6/1998 Sayah et al.
7,085,776 B2   8/2006 Callahan
(Continued)

FOREIGN PATENT DOCUMENTS

CN    106132494 A    11/2016
CN    106775752 A    5/2017
(Continued)

OTHER PUBLICATIONS

"Notification of Transmittal of the International Search Report and the Written Opinion of the International Searching Authority, or the Declaration," International Filing Date: Jun. 21, 2018, International Application No. PCT/US2018/038774, Applicant: Bentley Systems, Incorporated, Date of Mailing: Sep. 6, 2018, pp. 1-13.
(Continued)

*Primary Examiner* — Mariela Reyes
*Assistant Examiner* — Courtney Harmon
(74) *Attorney, Agent, or Firm* — Cesari and McKenna, LLP; James A. Blanchette

(57) ABSTRACT

In one embodiment, techniques are provided for modeling infrastructure from a plurality of modeling perspectives using an intelligent model hierarchy. A repository model for the infrastructure is generated that serves as a root of the intelligent model hierarchy. The repository model includes a root subject and one or more child subjects. One or more information partitions are generated for each subject, each information partition being associated with a respective modeling perspective. One or more child models are associated with each information partition. The one or more child models each containing one or more infrastructure elements that express the modeling perspective of the information partition with which the child model is associated. The repository model and the one or more child models are maintained together in a repository, and infrastructure elements of a selected model may be displayed on demand in a user interface of a client.

21 Claims, 4 Drawing Sheets

(51) Int. Cl.
*G06F 30/13* (2020.01)
*G06Q 10/06* (2023.01)
*G06Q 50/08* (2012.01)

(58) Field of Classification Search
CPC ........ G06F 16/212; G06F 16/93; G06F 30/13; G06Q 10/06; G06Q 50/08
See application file for complete search history.

(56) References Cited

U.S. PATENT DOCUMENTS

| | | | |
|---|---|---|---|
| 7,283,135 B1 | 10/2007 | Coté et al. | |
| 8,706,450 B2 | 4/2014 | Stolper | |
| 9,171,059 B2 | 10/2015 | Wood | |
| 2006/0184410 A1* | 8/2006 | Ramamurthy | G06Q 10/10 706/8 |
| 2007/0203678 A1 | 8/2007 | Horiike | |
| 2010/0280863 A1* | 11/2010 | Wilcock | G06Q 10/067 705/7.11 |
| 2014/0297230 A1 | 10/2014 | Grimm et al. | |
| 2016/0274553 A1* | 9/2016 | Strohmenger | G05B 17/02 |
| 2016/0292895 A1* | 10/2016 | Billi | G06T 11/60 |
| 2017/0123934 A1 | 5/2017 | Bentley | |
| 2017/0351226 A1* | 12/2017 | Bliss | G05B 19/4063 |
| 2018/0052835 A1* | 2/2018 | Billi-Duran | G06F 16/487 |
| 2018/0299849 A1* | 10/2018 | Martin | G05B 15/02 |
| 2018/0300437 A1* | 10/2018 | Thomsen | G06F 16/24573 |

FOREIGN PATENT DOCUMENTS

| | | |
|---|---|---|
| WO | WO-2012/028160 A1 | 3/2012 |
| WO | WO-2014/130424 A1 | 8/2014 |

OTHER PUBLICATIONS

U.S. Appl. No. 15/080,858, filed Mar. 25, 2016 by Keith A. Bentley et al. for Techniques for Conversion of CAD Descriptions, pp. 1-52.
"File Exporer-Wikipedia," Wikipedia, retrieved from the Internet: <https://en.wikipedia.org/w/index.php?title=File_Explorer&oldid=798136407>, retrieved from the Internet on Oct. 20, 2022, Aug. 31, 2017, pp. 1-16.

* cited by examiner

INTELLIGENT MODEL HIERARCHY FOR INFRASTRUCTURE MODELING

BACKGROUND

Technical Field

The present disclosure relates generally to computer-based modeling of infrastructure, and more specifically to techniques for modeling infrastructure from a plurality of modeling perspectives using a model hierarchy.

Background Information

Throughout the design, construction and operation of infrastructure (e.g., buildings, factories, roads, railways, bridges, etc.) it is often desirable to model the infrastructure using infrastructure modeling software. Models may take a number of different forms, characterizing various aspects of infrastructure (referred to as "modeling perspectives"). For example, a physical model may model infrastructure from a physical modeling perspective, characterizing physical aspects of entities. Likewise, a functional model may model infrastructure from a functional modeling perspective, characterizing functional aspects of entities. Depending on the implementation, a wide variety of other types of models may be used, corresponding to different modeling perspectives.

Models may have a variety of granularities, modeling various sized units of the infrastructure. For example, one physical model may model an entire facility, while a second physical model may model a single piece of equipment in that facility. Likewise, one functional model may model the entire process flow for a manufacturing line, while a second functional model may model a single stage of such process flow.

Traditionally, separate databases have been generated and maintained by infrastructure modeling software for each modeling perspective and each granularity. However, such an approach introduces data redundancies, where the same entity is separately modeled multiple times. The relation between different representations of the same entity often are not clearly defined, hindering effective "reasoning" based on the models by software, without human intervention. It may be difficult for software to determine that two different models (e.g., a course-grained model and a fine-grained model) are models of the same entity, so that the models do not "collide" with each other. Likewise, it may be difficult to avoid "double-counting" of models of the same entity when performing analysis (e.g., measuring a quality, such as mass, of a course-grained model or a fine-grained model of an entity, but not both).

In addition to such inefficiencies, data redundancies where the same entity is separately modeled multiple times can increase the likelihood of data inconsistencies, where one copy of data for an entity diverges from another copy of data for the same entity. Still further, data redundancies can consume excessive storage space (i.e., introduce storage inefficiencies) and consume extra processing power to separately access and manipulate (i.e., introduce processing inefficiencies).

What is needed are techniques for efficiently generating and maintaining a plurality of models of infrastructure from different modeling perspectives, at a plurality of different granularities, that address some or all of the above discussed shortcomings.

SUMMARY

Techniques are provided for using an intelligent model hierarchy to maintain models of infrastructure from a plurality of different modeling perspectives, and at a plurality of different granularities. Such techniques may enable effective "reasoning" and analysis based on the models by software without human intervention, reduce the likelihood of data inconsistencies, and/or avoid storage and processing inefficiencies, as well as provide other benefits.

In one specific embodiment, a repository model for the infrastructure is generated that serves as a root of an intelligent model hierarchy. The repository model includes a root subject that describes what the repository model 200 is about and one or more child subjects that further organize contents thereof. One or more information partitions are generated for each subject, each information partition being associated with a respective modeling perspective (e.g., such that each modeling perspective is reflected in one information partition of each subject). One or more child models are associated with each information partition. The one or more child models each contain one or more infrastructure elements that express the modeling perspective of the information partition with which the child model is associated. In cases where there is more than one child model associated an information partition, the plurality of child models are hierarchically organized, with one child model directly associated with the information partition functioning as a root and the remaining child models arranged hierarchically under that child model.

The repository model and the one or more child models are maintained together in a repository (e.g., of cloud-based services software), accessible to a client executed on a client device over the Internet. At least a portion of the intelligent model hierarchy may be copied to the client device. A user may indicate a model they desire to view, specifying at least a subject and an information partition in a user interface of the client. In response to the user input, a model is selected from the intelligent model hierarchy (e.g., either in the cloud-based repository or on the client device). The client thereafter displays at least one infrastructure element of the selected model in its user interface, to enable the user to view information about the infrastructure.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings, of which.

DETAILED DESCRIPTION

Definitions

As used herein the term "infrastructure" refers to a physical structure or object that has been built, or is planned to be built, in the real world. Examples of infrastructure include buildings, factories, roads, railways, bridges, etc.

As used herein, the term "built infrastructure schema" or "BIS" refers to a conceptual schema (i.e. a conceptual data model) that describes the semantics of data describing infrastructure. A BIS may be implemented using a number of underlying databases systems (e.g., a SQLite database system), with structures in the BIS mapped to a database schema (e.g., a DgnDb schema).

As used herein, the term "repository" refers to an electronic storage location for infrastructure data, such as a database. A repository may conform to a BIS.

As used herein, the term "briefcase" refers to a copy of at least a portion of a repository. A briefcase may be composed of one or more files (e.g., SQLite files) structured according to a database schema (e.g., a DgnDb schema). A briefcase is typically, though not necessarily, kept synchronized with a repository.

As used herein, the term "element" refers to a record maintained in a repository or briefcase that represents (i.e. serves as a proxy for) an entity in the real world, such as an individual unit of infrastructure. An element that represents infrastructure in the real world is referred to herein as an "infrastructure element."

As used herein, the term "model" refers to a set of elements maintained in a repository or briefcase that describe (i.e. model) an aspect of an entity in the real world, such as an individual unit of infrastructure. Model may nest. That is, a model may describe (i.e. model) a particular element (e.g. an infrastructure element) and contain a set of other elements that are constituent parts of the modeled element.

As used herein, the term "modeling perspective" refers to an aspect (e.g., physical, functional, definitional, etc.) of an entity in the real world, such as an aspect of infrastructure.

As used herein, the term "subject" refers to a data structure maintained in a repository or briefcase that is an organizational subdivision of a model. A subject may describe the overall contents of the model or a sub portion of the model.

As used herein, the term "information partition" refers to a data structure maintained in repository or briefcase that is an organization subdivision of a subject related to a particular modeling perspective.

As used herein, the term "enterprise" refers to a company or organization.

Example Embodiment

Figure 1:
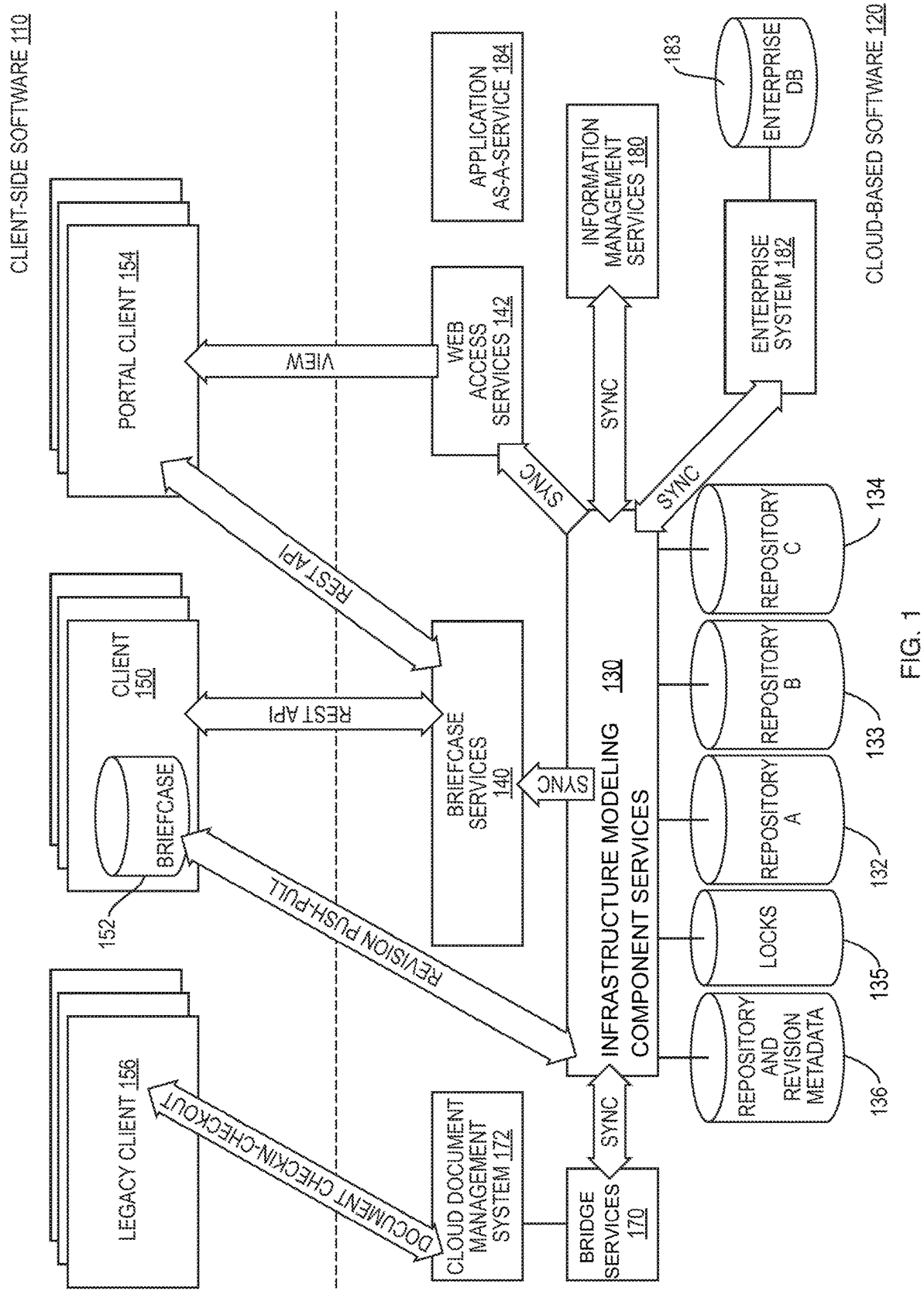
FIG. 1 is a high-level block diagram of at least a portion of an example infrastructure modeling software architecture.

FIG. 1 is a high-level block diagram of at least a portion of an example infrastructure modeling software architecture. The architecture may be divided into a client-side software 110 executing on one more or more computing devices arranged locally on-premises or hosted for an enterprise's use (collectively "client devices"), and cloud-based services software 120 that is executed on one or more remote computing devices ("cloud computing devices") accessible to the enterprise, and other enterprises, over the Internet.

At the core of the cloud-based services software 120 are infrastructure modeling component services 130 (e.g., iModel™ hub services) that provide centralized management and synchronization support. The infrastructure modeling component services 130 manage repositories 132, 133, 134. The repositories 130 may take the form of databases (e.g., iModel™ databases) embodied as one or more files (e.g., DgnDb files). The files may be structured using a database system (e.g., a SQLite database system) according to a database schema (e.g., a DgnDb schema), with structures in a BIS mapped to structures in the database schema. Each repository 130, 133, 134 may be replicated in the cloud to have multiple copies that may be operated upon independently (e.g., with eventual consistency). Further, a number of repositories may be federated to share common services of the cloud-based services software 120. Repositories 132, 133, 134 may integrate information from many sources, and the infrastructure modeling component services 130 may maintain locks (e.g., according to a pessimistic locking approach) in a locks database 135. Further, the infrastructure modeling component services 130 may maintain a repository and revision metadata database 136 that stores creation and revision history information for the repositories 132, 133, 134.

To permit distributed, potentially disconnected, operation, the infrastructure modeling component services 130 operate together with briefcase services 140 (e.g., iModel™ briefcase services) to provide certain practitioner applications operating as clients 150 a copy of at least a portion of data from the repositories 132, 133, 134. Clients 150 may be executed locally on desktop or mobile computing devices of an enterprise or hosted for the enterprise's use. The portion of data from each repository 132, 133, 134 provided to a client 150 is structured as a briefcase (e.g., an iModel™ briefcase) 152 embodied as one or more files (e.g., SQLite files) according to a database schema (e.g., a DgnDb schema). Each briefcase 152 is typically kept synchronized with its corresponding repository 132, 133, 134 through revision push/pull operations. Further, each client 150 may utilized a Hypertext Transfer Protocol (HTTP)-based representational state transfer (REST) application program interface (API) to communicate with the briefcase services 140. The briefcase services 140 may provide clash detection, validation, costing, publishing, analytics, and other services for a briefcase 152.

Web access services 142 that are synchronized with the infrastructure modeling component services 130 may operate together with the briefcase services 140 to provide a view of repositories 132, 133, 134 to certain practitioner applications operating as portal clients 154. Portal clients 154 may be web based, executed locally on desktop or mobile computing devices or hosted. They receive live or published views from web access services 142. Further they communicate with the briefcase services 140 via a HTTP-based REST API. Such portal clients 154 generally do not maintain a local briefcase, but instead rely upon connectivity to the cloud-based services software 120.

Certain legacy practitioner applications may rely on older technologies and data formats. To support such legacy practitioner applications operating as legacy clients 154, the component services 130 may work together with bridge services (e.g., iModel™ bridge services) 170. A cloud document management system 172 may implement a document check in-check out system for a number of legacy file formats (e.g., DGN, DWG, RCT, IFC, etc.). The bridge services 170 incrementally convert data from a file in a legacy file format maintained by the cloud document management system 172 into data in a repository 132, 133, 134 when changes are made to the file by a legacy client 156.

The infrastructure modeling component services 130 may further interact with a number of cloud-based services that perform information management and support functions. Information services 180 manage asset data, project data, reality data, internet of things (IoT) data, codes, and other features. An enterprise system 182 manages an on-site or hosted enterprise database 183 storing enterprise-specific data. Further, an application-as-a-service platform 184 provides insights, deliverables management, package management, as well as a variety of other services.

The repositories 132, 133, 134 referred to above typically include a number of models from different modeling perspectives and having different granularities. In one embodiment, the models are organized according to an intelligent model hierarchy that avoids problematic data redundancies.

Figure 2:
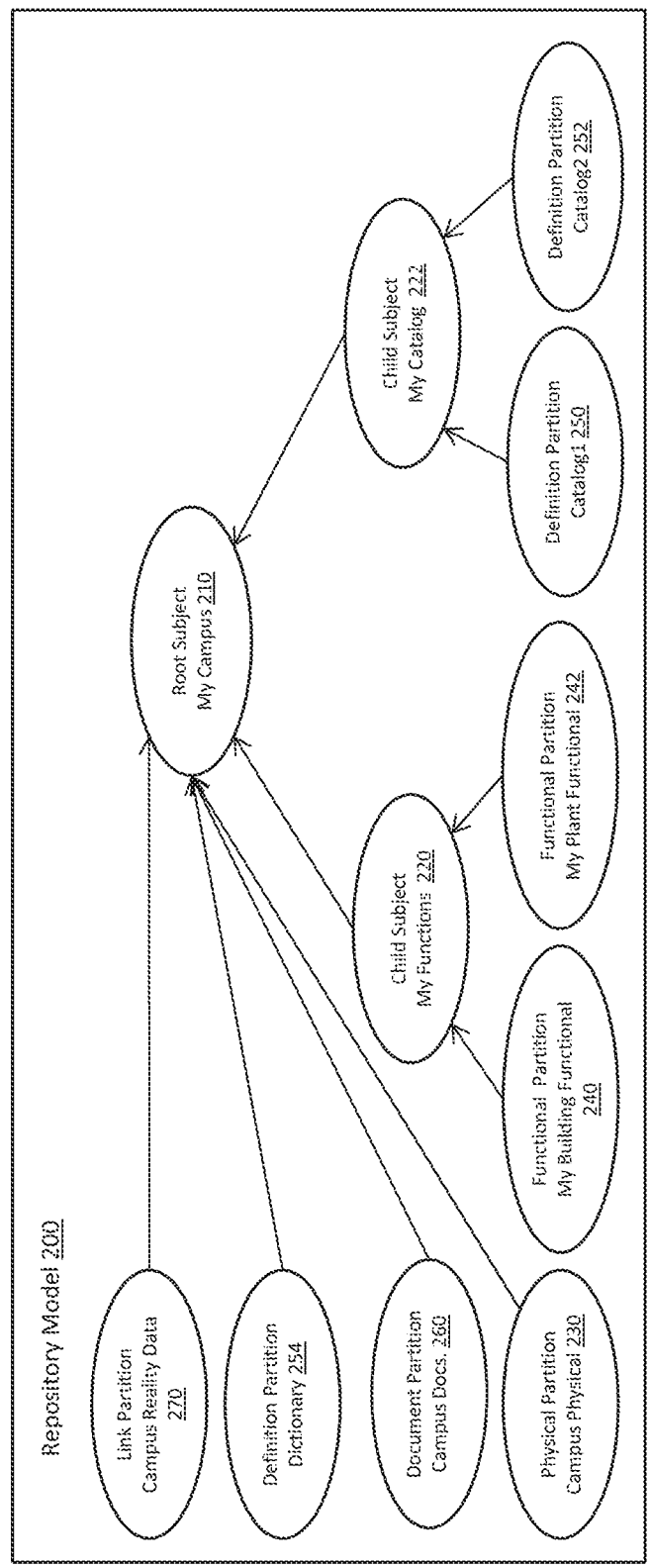
FIG. 2 is a block diagram of an example repository model that may be included within an example repository.

FIG. 2 is a block diagram of an example repository model that may be included within an example repository 132. A repository includes a single a repository model that serves as a root of the intelligent model hierarchy. The repository model 200 models a high level element, e.g., models an infrastructure element that represent a high level unit of infrastructure in the real world. In one specific example, which is further referenced below (referred to herein as the "campus" example), the repository model 200 models a campus element, which represents a campus of an enterprise. The repository model 210 may be automatically created within the repository when the repository is created (e.g., by a repository creation method). In some implementations, while the repository model 200 may be added to or changed (e.g., elements may be inserted into or updated within the repository model 200), the repository model 200 itself cannot be deleted, to ensure that a repository always includes a repository model.

The repository model 200 includes one or more subjects that may be organized into a hierarchy. A single root subject 210 (i.e. a subject that has no parent) is included that describes what the repository model 200 is about. The root subject 210 may be specified as part of initial repository creation (e.g., by a parameter of a repository creation method) and automatically added to the repository model 200. Typically, while the root subject 210 may be changed, it may not be deleted, such that a repository model 200 always has a root subject. Continuing the specific "campus" example introduced above, a root subject 210 may specify that the repository model 200 models a campus (i.e. a "My Campus" root subject as shown in FIG. 2).

The repository model 200 may also include one or more child subjects 220, 222 (i.e. a subject that has another subject as a parent), which describe portions of the repository model 200, in order to further organize contents thereof. A child subject 220, 222 may be specified subsequent to repository creation (e.g., by an individual subject creation method). In contrast to the root subject, a repository model 200 may or may not have child subjects. Continuing the specific "campus" example introduced above, child subjects 220, 222 may describe that the sub portions of the repository model 200 model functions and catalogs related to the campus element (i.e. a "My Functions" child subject and a "My Catalogs" child subject as shown in FIG. 2).

Each subject (either the root subject 210 or a child subject 220, 222) has one or more information partitions 230-260 associated with a respective modeling perspective that indicate how the respective subject is modeled. A physical information partition 230 may be associated with a physical modeling perspective that describes physical relationships. A functional information partition 240 may be associated with a functional modeling perspective that describes functional relationships. A definition information partition 250 may be associated with a definitional modeling perspective that describes types of elements, categories, or views. A documentation information partition 260 may be associated with a documentary modeling perspective that describes drawings. Further, a special link information partition 270 may provide external reference to models in another repository, continuing the hierarchy outside of the present repository.

Continuing the specific "campus" example introduced above, a physical information partition 230 (i.e. a "My Campus Physical" information partition) is provided for physical relationships in the campus, multiple functional information partitions 240 (i.e. a "My Plant Functional" and a "My Building Functional" information partition) are provided for functions of respective structures that make up the campus, multiple definition information partitions 250, 252, 254 (i.e. a "Catalog 1", "Catalog 2" and "Dictionary" information partition) are provided for types of elements, categories, and views of the campus or portions thereof, a documentation information partition 260 (i.e. a "Campus Documents" information partition) is provided for drawings of the campus or portions thereof and graphics used therein, and a link information partition 270 (i.e. a "Campus Reality Data" information partition) is provided for linking to a point cloud of the campus or portions thereof stored outside of the present repository 132.

Figure 3:
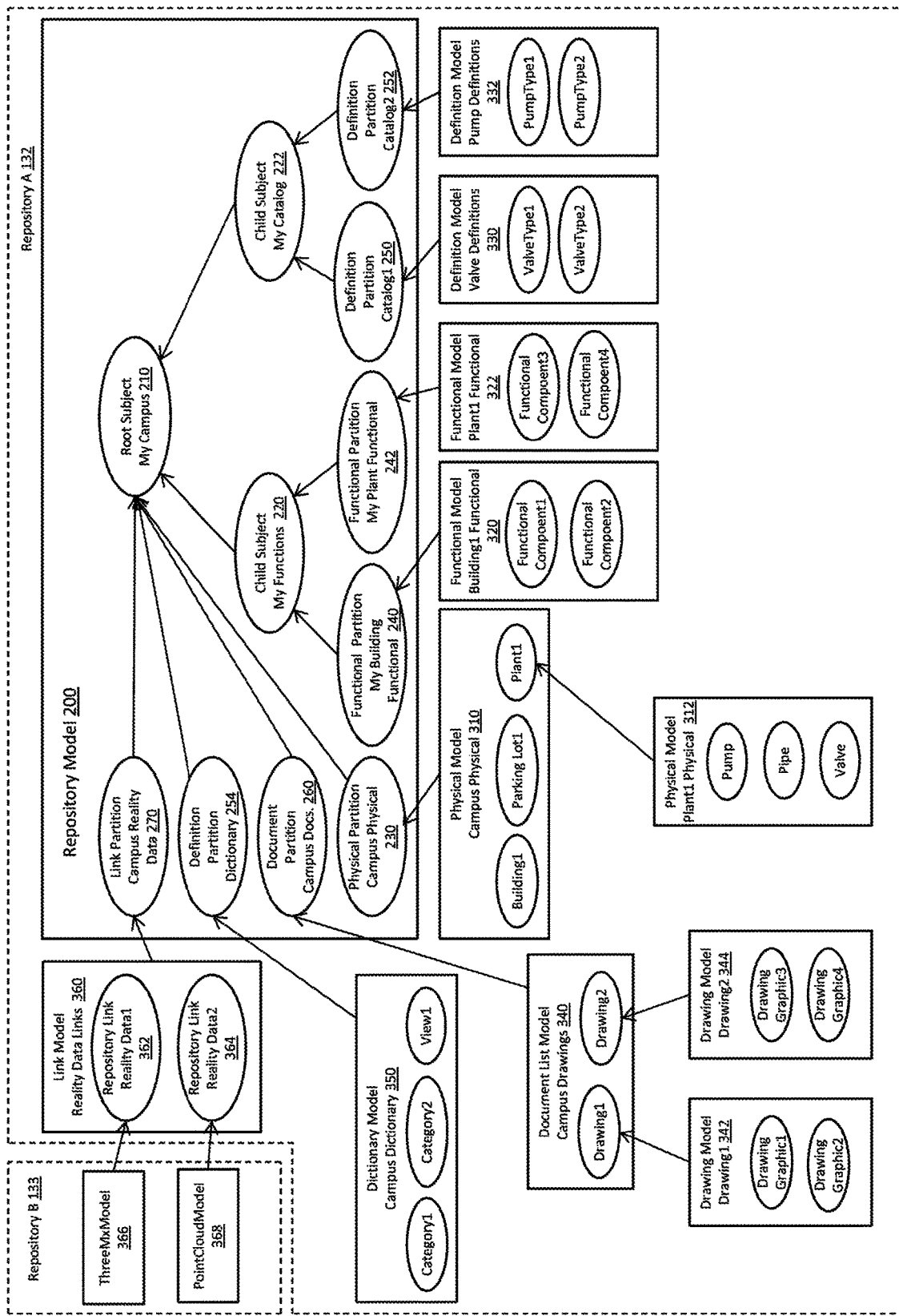
FIG. 3 is an expanded block diagram showing the example repository model of FIG. 2 together with example child models.

FIG. 3 is an expanded block diagram showing the example repository model of FIG. 2 together with child models 310-360. One or more child models 310-360 stored in the repository 132 are associated with each information partition 230-260. Each child model 310-360 typically models exactly one element (e.g., exactly one infrastructure element) and contains one or more elements (e.g., one or more infrastructure elements) that collectively form the modeled element. The contained elements may express the modeling perspective of the respective information partition. For example, a physical model 310 may be associated with a physical information partition 230 and contain elements that express physical aspects of entities, a functional model 320, 322 may be associated with a functional information partition 240, 242 and contain elements that express functional aspects of entities, a definition model 330, 332 or dictionary models 350 may be associated with a definition information partition 250, 252, 254 and describe types of elements, categories, or views, a document list model 340 may be associated with a documentation information partition 260 and describe drawings and drawing graphics, etc. Still further, a link model 360 may maintain links to models in another repository 133, continuing the hierarchy across repositories.

In cases where there is more than one child model associated an information partition, the plurality of child models are hierarchically organized, with one child model directly associated with the information partition functioning as a root and the remaining child models arranged hierarchically under that child model. The information partitions 230-260 are referenced by root child models (e.g., a physical model 310, a document list model 340, etc.). Second level child models (e.g., a physical model 312, a drawing model 342, etc.) may model elements contained in the root child models. This pattern may be repeated to provide additional levels of child models under an information partition.

Continuing the specific "campus" example introduced above, a physical model of the campus (i.e. a root "Campus Physical" model) 310 is associated with a physical information partition 230 (i.e. a "My Campus Physical" information partition) and contains infrastructure elements that represent a building (i.e. a "Building 1" element", a parking lot (i.e. a "Parking Lot1" element) and a plant (i.e. a "Plant1" element). A child model of the plant (i.e. a second level "Plant1 Physical" model) 312 is associated with an infrastructure element representing the plant (i.e. the "Plant1" element) and contains infrastructure elements that represent portions of the plant (i.e. a "Pump" element, a "Pipe" element, a "Valve" element, etc.). Likewise, a functional model of a building (i.e. a "Building1 Functional" model) 320 is associated with the functional information partition 240 (i.e. a "My Building Functional" information partition) and contains infrastructure elements that represent functional components of the building (i.e. a "Functional Component1" element, a "Functional Component2" element, etc.), and a functional model of the plant (i.e. a "Plant1 Functional" model) 320 is associated with the functional information partition 240 (i.e. a "My Plant Functional" information partition) and contains infrastructure elements that are functional components of the plant (i.e. a "Functional Component3" element, a "Functional Component4" element, etc.).

Further, a definition model for valve elements (i.e. a "Valve Definitions" model) 330 is associated with a definition information partition 250 (i.e. a "Catalog1" information partition) and describes the types of valve elements that may be used in other models (i.e. "ValveType1", "ValveType2", etc.), and a definition model for pump elements (i.e. a "Pump Definitions" model) 332 is associated with a definition information partition 252 (i.e. a "Catalog2" information partition) and describes types of pump elements that may be used in other models (i.e. "PumpType1", "PumpType2", etc.). Similarly, a dictionary model for categories and views (i.e. a "Campus Dictionary" model) 350 is associated with a definition information partition 254 (i.e. a "Dictionary" information partition) and describes categories and views that may be maintained for use with other models of the campus or portions thereof.

Still further, a document list model (i.e. a root "Campus Drawings" model) 340 is associated with the document information partition 250 (i.e. the "Campus Documents" information partition) and includes drawings (e.g., 2D drawings) representing the campus or portions thereof (i.e. "Drawing1", "Drawing2", etc.). A child model of a first drawing (i.e. a second level "Drawing1" model) 342 contains drawing graphics (i.e. a "Drawing Graphic1", a "Drawing Graphic2", etc.) used in the first drawing, and a child model of a second drawing (i.e. a second level "Drawing2" model) 344 contains drawing graphics (i.e. a "Drawing Graphic3", a "Drawing Graphic4", etc.) used in the second drawing. In addition, a link model (i.e. a "Reality Data Links" model) 360 is associated with the link partition 270 (i.e. the "Campus Reality Data" information partition) and includes links 362, 364 (i.e. a "RealityData1" link, a "RealityData2", etc.) to models 366, 368 in another repository 133 (i.e. a "ThreeMxModel" model, a "PointCloudModel" model, etc.) that store reality data descriptive of the campus or a portion thereof.

Figure 4:
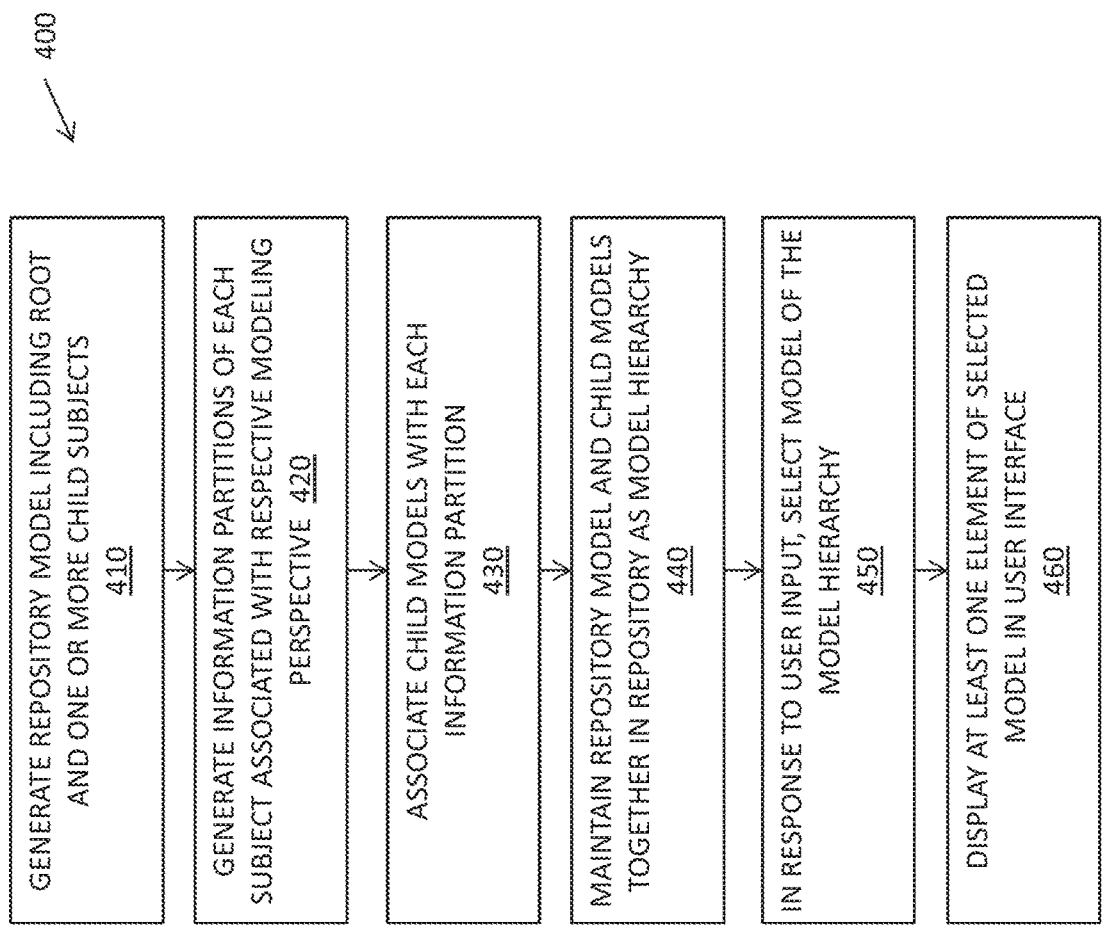
FIG. 4 is a flow diagram of an example sequence of steps for modeling infrastructure using an intelligent model hierarchy.

FIG. 4 is a flow diagram of an example sequence of steps 400 for modeling infrastructure using an intelligent model hierarchy. At step 410, the infrastructure modeling component services 130, in connection with creation of a repository 132, generates a repository model (e.g., a single repository model) that serves as a root of an intelligent model hierarchy. The repository model includes a root subject (e.g., a single root subject) and one or more child subjects. At step 420, the infrastructure modeling component services 130 generate one or more information partitions of each subject of the root subject and the one or more child subjects. Each information partition is associated with a respective modeling perspective (e.g., such that each modeling perspective is reflected in one information partition of each subject). At step 430, the infrastructure modeling component services 130 associate one or more child models with each information partition. The one or more child models each contain one or more elements that express the modeling perspective of the information partition with which the child model is associated. In cases where there is more than one child model associated an information partition, the plurality of child models are hierarchically organized, with one child model directly associated with the information partition functioning as a root and the remaining child models arranged hierarchically under that child model. At step 440, the infrastructure modeling component services 130 maintains the repository model and the one or more child models of the now-created intelligent model hierarchy together in the repository 132. At least a portion of the repository model may be copied to a briefcase 152 maintained at a client 150. Subsequently, a user may indicate a model they desire to view, specifying, for example, a subject, an information partition, a child model, etc. in a user interface of the client 150. At step 450, in response to the user input, the infrastructure modeling component services 130 selects a model of the intelligent model hierarchy from the repository 132 and provides it to the client 150, or if the information is already at the client 150, the client selects a model of the intelligent model hierarchy from the briefcase 152. At step 460, the client 150 displays at least a portion (e.g., at least one element) of the selected model in its user interface, to enable the user to view information about the infrastructure from the intelligent model hierarchy.

In conclusion, the above description details techniques for modeling infrastructure from a plurality of modeling perspectives using an intelligent model hierarchy. It should be understood that such techniques may enable effective "reasoning" and analysis based on the models by software without human intervention, reduce the likelihood of data inconsistencies, and/or avoid storage and processing inefficiencies, as well as provide other benefits.

It should be understood that a wide variety of adaptations and modifications may be made to the techniques. In general, functionality may be implemented in software, hardware or various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:

1. A method for modeling infrastructure from a plurality of modeling perspectives and granularities using an intelligent model hierarchy created by an infrastructure modeling software architecture, comprising:

generating a repository model that models an infrastructure element that represents a particular unit of infrastructure, the infrastructure being a physical structure or object that has been built or is planned to be built in the real-world, the repository model serving as a root of the intelligent model hierarchy, the repository model including a hierarchy of subjects with a root subject and one or more child subjects, wherein each subject is a data structure maintained in a repository or briefcase that serves as an organizational subdivision of the repository model;

generating one or more information partitions of each subject of the root subject and the one or more child subjects, each information partition being an organizational subdivision of a subject that expresses a respective modeling perspective of the plurality of modeling perspectives that characterizes an aspect of infrastructure, the plurality of modeling perspectives including a physical modeling perspective, a functional modeling perspective, a definitional modeling perspective and a documentary modeling perspective;

associating a plurality of child models that serve as children of the root in the intelligent model hierarchy with at least one of the one or more information partitions that are organizational subdivisions of subjects, the child models each modeling a single element that represents an aspect of the physical structure or object and containing one or more other elements that collectively form the modeled single element, each of the one or more contained elements expressing the modeling perspective of the information partition with which the child model is associated;

maintaining the repository model and the plurality of child models of the intelligent model hierarchy together in a storage location;

selecting a model of the intelligent model hierarchy, in response to user input in a user interface of a client executing on a client device, the user input indicating at least a subject and an information partition, and displaying an infrastructure element of the selected model in a user interface of the client shown on the client device.

2. The method of claim 1, wherein the repository is maintained by cloud-based services software in a cloud-based repository, and the method further comprises:

transferring a copy of at least a portion of the intelligent model hierarchy over the Internet to be maintained at the client device, the at least the portion of the repository model including the selected model of the intelligent model hierarchy.

3. The method of claim 1, wherein the repository includes only a single repository model, and the repository model includes only a single root subject.

4. The method of claim 1, wherein each subject of the root subject and the one or more child subjects includes a single information partition for each modeling perspective.

5. The method of claim 1, wherein the plurality of child models is hierarchically organized with one child model directly associated with the information partition functioning as a root and the remaining child models arranged hierarchically under that child model.

6. The method of claim 1, wherein at least one subject of the root subject and the one or more child subjects includes an external reference to another repository.

7. The method of claim 1, wherein the plurality of modeling perspectives include a physical modeling perspective that describes physical relationships among units of infrastructure, and the child models include at least one physical model.

8. The method of claim 1, wherein the plurality of modeling perspectives include a functional modeling perspective that describes functional relationships among units of infrastructure, and the child models include at least one functional model.

9. The method of claim 1, wherein the plurality of modeling perspectives include a definitional modeling perspective or a documentary modeling perspective, and the child models include at least one definition model, or dictionary model, or document list model or drawing model.

10. An infrastructure modeling software architecture for modeling infrastructure from a plurality of modeling perspectives and granularities using an intelligent model hierarchy, including a client executing on a local computing device, the client including a user interface; and infrastructure modeling component services software executing on one or more cloud computing devices remote from the client, the infrastructure modeling component services software configured to:

maintain a repository that includes a repository model that models an infrastructure element that represents a particular unit of infrastructure, the infrastructure being a physical structure or object that has been built or is planned to be built in the real-world, the repository model serving as a root of the intelligent model hierarchy, the repository model including a hierarchy of subjects with a root subject and one or more child subjects wherein each subject is a data structure maintained in a repository or briefcase that serves as an organizational subdivision of the repository model, each subject of the root subject and the one or more child subjects including one or more information partitions that organizationally subdivide the subject and that express a respective modeling perspective of the plurality of modeling perspectives that characterizes an aspect of infrastructure, at least one of the one or more information partitions that are organizational subdivisions of subjects associated with a plurality of child models that serve as children of the root in the intelligent model hierarchy, the plurality of child models each modeling a single element that represents an aspect of the physical structure or object and containing one or more other elements that collectively form the modeled single element, each of the one or more contained elements expressing the modeling perspective of the information partition with which the child model is associated;

receive a selection of a model of the intelligent model hierarchy over the Internet from the client; and transfer a copy of at least a portion of the intelligent model hierarchy over the Internet to the client device, the at least the portion of the repository model including the selected model of the intelligent model hierarchy, wherein the client is configured to display an infrastructure element of the selected model in the user interface of the client.

11. The infrastructure modeling software architecture of claim 10, wherein the repository includes only a single repository model, and the repository model includes only a single root subject.

12. The infrastructure modeling software architecture of claim 10, wherein each subject of the root subject and the one or more child subjects includes a single information partition for each modeling perspective.

13. The infrastructure modeling software architecture of claim 10, wherein the plurality of child models is hierarchically organized with one child model directly associated with the information partition functioning as a root and the remaining child models arranged hierarchically under that child model.

14. The infrastructure modeling software architecture of claim 10, wherein at least one subject of the root subject and the one or more child subjects includes an external reference to another repository.

15. The infrastructure modeling software architecture of claim 10, wherein the plurality of modeling perspectives include a physical modeling perspective that describes physical relationships among units of infrastructure, and the child models include at least one physical model.

16. The infrastructure modeling software architecture of claim 10, wherein the plurality of modeling perspectives include a functional modeling perspective that describes functional relationships among units of infrastructure, and the child models include at least one functional model.

17. The infrastructure modeling software architecture of claim 10, wherein the plurality of modeling perspectives include a definitional modeling perspective or a documentary modeling perspective, and the child models include at least one definition model, dictionary model, document list model or a drawing model.

18. The infrastructure modeling software architecture of claim 10, wherein each child model models exactly one element that is composed of the one or more elements contained in the child model.

19. A non-transitory computer readable medium having software encoded thereon, the software when executed by one or more computing devices operable to:
generate a repository model that models an infrastructure element that represents a particular unit of infrastructure, the infrastructure being a physical structure or object that has been built or is planned to be built in the real-world, the repository model serving as a root of an intelligent model hierarchy, the repository model including a hierarchy of subjects with a root subject and one or more child subjects, wherein each subject is a data structure maintained in a repository or briefcase that serves as an organizational subdivision of the repository model;
generate one or more information partitions of each subject of the root subject and the one or more child subjects, each information partition expressing a respective modeling perspective of a plurality of modeling perspectives that characterizes an aspect of infrastructure, the plurality of modeling perspectives including a physical modeling perspective, a functional modeling perspective, a definitional modeling perspective and a documentary modeling perspective;
associate a plurality of child models that serve as children of the root in the intelligent model hierarchy with at least one of the one or more information partitions that are organizational subdivisions of subjects, the plurality of child models each modeling a single element that represents an aspect of the physical structure or object and containing one or more other elements that collectively form the modeled single element, each of the one or more contained elements expressing the modeling perspective of the information partition with which the child model is associated;
maintain the repository model and the plurality of child models of the intelligent model hierarchy together in a storage location;
select a model of the intelligent model hierarchy; and
display an infrastructure element of the selected model.

20. A method for modeling infrastructure, comprising:
generating a repository model that models a particular unit of infrastructure, the infrastructure being a physical structure or object that has been built or is planned to be built in the real-world, the repository model serving as a root of the intelligent model hierarchy, the repository model including a hierarchy of subjects with a root subject and one or more child subjects, wherein each subject is a data structure maintained in a repository or briefcase that serves as an organizational subdivision of the repository model;
generating one or more information partitions of each subject of the root subject and the one or more child subjects, each information partition being an organizational subdivision of a subject that expresses a respective modeling perspective of the plurality of modeling perspectives that characterizes an aspect of infrastructure;
associating a plurality of child models with at least one of the one or more information partitions, wherein the plurality of child models are hierarchically organized with one child model directly associated with the information partition functioning as a root and the remaining child models arranged hierarchically under that child model, and each child model is a data structure that models a single element and contains one or more other elements that collectively form the modeled single element, and wherein the single element and the one or more other elements are each records maintained in a repository or briefcase that represent an aspect of the physical structure or object and express the modeling perspective of the information partition with which the child model that models or contains the element is associated;
storing the repository model and the plurality of information partitions, the plurality of child models, and the modeled and contained elements thereof in a repository or briefcase; and
providing, in response to user input in a user interface of a client executing on a client device, information for the particular unit of infrastructure from the repository model or the plurality of information partitions, the plurality of child models, or the modeled and contained elements thereof.

21. An apparatus for modeling infrastructure comprising:
one or more computing device each having a processor and a memory, and configured to execute infrastructure modeling software that is operable to
generate a repository model that models a particular unit of infrastructure, the infrastructure being a physical structure or object that has been built or is planned to be built in the real-world, the repository model serving as a root of the intelligent model hierarchy, the repository model including a hierarchy of subjects with a root subject and one or more child subjects, wherein each subject is a data structure maintained in a repository or briefcase that serves as an organizational subdivision of the repository model,
generate one or more information partitions of each subject of the root subject and the one or more child subjects, each information partition being an organizational subdivision of a subject that expresses a respective modeling perspective of the plurality of modeling perspectives that characterizes an aspect of infrastructure, associate a plurality of child models with at least one of the one or more information partitions, wherein the plurality of child models are hierarchically organized with one child model directly associated with the information partition functioning as a root and the remaining child models arranged hierarchically under that child model, and each child model is a data structure that models a single element and contains one or more other elements that collectively form the modeled single element, and wherein the single element and the one or more other elements are each records maintained in a repository or briefcase that represent an aspect of the physical structure or object and express the modeling perspective of the information partition with which the child model that models or contains the element is associated, store the repository model and the plurality of information partitions, the plurality of child models, and the modeled and contained elements thereof in a repository or briefcase, and provide information for the particular unit of infrastructure from the repository model or the plurality of information partitions, the plurality of child models, or the modeled and contained elements thereof.

* * * * *